United States Patent
Cho et al.

(10) Patent No.: US 7,642,161 B2
(45) Date of Patent: Jan. 5, 2010

(54) METHOD OF FABRICATING RECESS GATE IN SEMICONDUCTOR DEVICE

(75) Inventors: Yong-Tae Cho, Kyoungki-do (KR); Eun-Mi Kim, Kyoungki-do (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 556 days.

(21) Appl. No.: 11/644,880

(22) Filed: Dec. 26, 2006

(65) Prior Publication Data
US 2008/0003748 A1    Jan. 3, 2008

(30) Foreign Application Priority Data
Jun. 29, 2006  (KR) ............ 10-2006-0060007
Dec. 8, 2006   (KR) ............ 10-2006-0124734

(51) Int. Cl.
*H01L 21/336* (2006.01)
(52) U.S. Cl. .......... 438/259; 257/E21.545; 257/E29.26; 438/296; 438/294
(58) Field of Classification Search .......... 438/259, 438/196, 207, 248, 294, 296
See application file for complete search history.

(56) References Cited

U.S. PATENT DOCUMENTS

| | | | |
|---|---|---|---|
| 7,326,619 B2 * | 2/2008 | Park et al. ............ | 438/282 |
| 2005/0042833 A1 | 2/2005 | Park et al. | |
| 2005/0277254 A1 * | 12/2005 | Ha et al. ............ | 438/259 |
| 2006/0065922 A1 * | 3/2006 | Kleint et al. ............ | 257/324 |
| 2006/0220085 A1 * | 10/2006 | Huo et al. ............ | 257/296 |
| 2006/0234451 A1 * | 10/2006 | Slesazeck et al. ....... | 438/259 |
| 2006/0237817 A1 * | 10/2006 | Park ............ | 257/500 |
| 2007/0004127 A1 * | 1/2007 | Lee ............ | 438/243 |
| 2007/0007571 A1 * | 1/2007 | Lindsay et al. ....... | 257/306 |
| 2007/0164359 A1 * | 7/2007 | Chang et al. ....... | 257/347 |
| 2007/0173007 A1 * | 7/2007 | Lee et al. ............ | 438/209 |

FOREIGN PATENT DOCUMENTS

| | | |
|---|---|---|
| CN | 1239826 | 12/1999 |
| CN | 1272686 | 11/2000 |
| CN | 1523643 | 8/2004 |
| KR | 1020060008044 | 1/2006 |
| KR | 1020060071940 | 6/2006 |
| KR | 1020060074080 | 7/2006 |

OTHER PUBLICATIONS

Notice of Allowance for Korean app. 10-2006-0124734.
Patent Certificate and Granted Patent Publication dated May 20, 2009, for Chinese application No. 200710101740.4.
Office Action issued by Chinese Patent Office for Chinese Patent app. 200710101740.4.

* cited by examiner

*Primary Examiner*—Thao P. Le
(74) *Attorney, Agent, or Firm*—Lowe Hauptman Ham & Berner, LLP

(57) ABSTRACT

A method of fabricating a semiconductor device includes forming an isolation structure in a substrate to define an active region, forming a recess mask pattern over the isolation structure and the active region, etching the isolation structure exposed by the recess mask pattern to a certain depth, etching the substrate to form a recess pattern, and forming a gate electrode over the recess pattern.

19 Claims, 5 Drawing Sheets

US 7,642,161 B2

METHOD OF FABRICATING RECESS GATE IN SEMICONDUCTOR DEVICE

CROSS-REFERENCES TO RELATED APPLICATIONS

The present invention claims priority of Korean patent application numbers 10-2006-0060007 and 10-2006-0124734, filed on Jun. 29, 2006 and Dec. 8, 2006, which are incorporated by reference in their entirety.

BACKGROUND OF THE INVENTION

The present invention relates to a method of fabricating a semiconductor device, and more particularly, to a method of fabricating a recess gate in a semiconductor device.

With the increase of integration density of semiconductor devices, it is difficult for a typical forming method of a planar gate to sufficiently secure refresh characteristics of the device, because junction leakage is caused by the increase of electric field as a gate channel length decreases and an implant doping concentration increases.

To solve the above limitation, a recess gate forming process is performed in such a way that an active region is patterned to form a recess therein and a conductive material is then filled into the recess to thereby form a recess gate. This recess gate process makes it possible to increase the gate channel length and decrease the implant doping concentration so that the refresh characteristics of the device can be enhanced accordingly.

FIGS. 1A and 1B illustrate cross-sectional views of a recess pattern of a semiconductor device according to the typical method. FIGS. 1C and 1D illustrate scanning electron microscope (SEM) micrographs of a horn occurring in the typical semiconductor device. Here, FIG. 1A is a sectional view taken along a major axis direction of an active region, and FIG. 1B is a sectional view taken along a minor axis direction of the active-region.

Referring to FIGS. 1A and 1B, an isolation structure 12 is formed in a substrate 11 to define an active region. A recess pattern 13 is formed using a recess mask and etch processes. The isolation structure 12 is formed through a typical shallow trench isolation (STI) process. A trench for device isolation is formed in a certain region of the substrate 11 such that the trench has an inclined sidewall of which a tilt angle ($\alpha$) is 85° or smaller (refer to FIGS. 1B and 1C), for securing a gap-fill property of a device isolation insulating structure which will be formed in a following process. In addition, in order to secure an effective field oxide height (EFH), the isolation structure 12 is formed such that a top surface of the isolation structure 12 is higher than a top surface of the substrate 11 (see FIG. 1D).

Meanwhile, the recess pattern 13 has a V-shaped profile. Resultantly, due to the tilt angle ($\alpha$) of the isolation structure 12, the EFH, and the V-shaped profile of the recess pattern 13, a horn H occurs at a portion where the recess pattern 13 and the isolation structure 12 are in contact with each other. Such a horn H causes a characteristic of a gate insulating layer to be degraded, and the horn H serves as a weak point vulnerable to stress. Moreover, the horn acts as a leakage current source, which leads to a lower yield.

SUMMARY OF THE INVENTION

Embodiments of the present invention are directed to provide a method for fabricating a recess gate in a semiconductor device, which can improve a characteristic of a recess gate by removing or minimizing a horn of a recess pattern, which may be a weak point vulnerable to stress and a source of leakage current.

In accordance with an aspect of the present invention, there is provided a method of fabricating a semiconductor device, including: forming an isolation structure in a substrate to define an active region; forming a recess mask pattern over the isolation structure and the active region; etching the isolation structure exposed by the recess mask pattern to a certain depth; etching the substrate to form a recess pattern; and forming a gate electrode over the recess pattern.

In accordance with another aspect of the present invention, there is provided method of fabricating a semiconductor device, including: forming an isolation structure in a silicon substrate to define an active region; forming a buffer oxide layer over the isolation structure and the active region; forming a recess mask pattern over the buffer oxide layer; etching the isolation structure and the buffer oxide layer exposed by the recess mask pattern; forming a recess pattern by etching the silicon substrate with a first recipe having an etch rate greater for the silicon substrate than the buffer oxide layer or the isolation structure; and forming a gate electrode over the recess pattern.

DESCRIPTION OF SPECIFIC EMBODIMENTS

Figure 2:
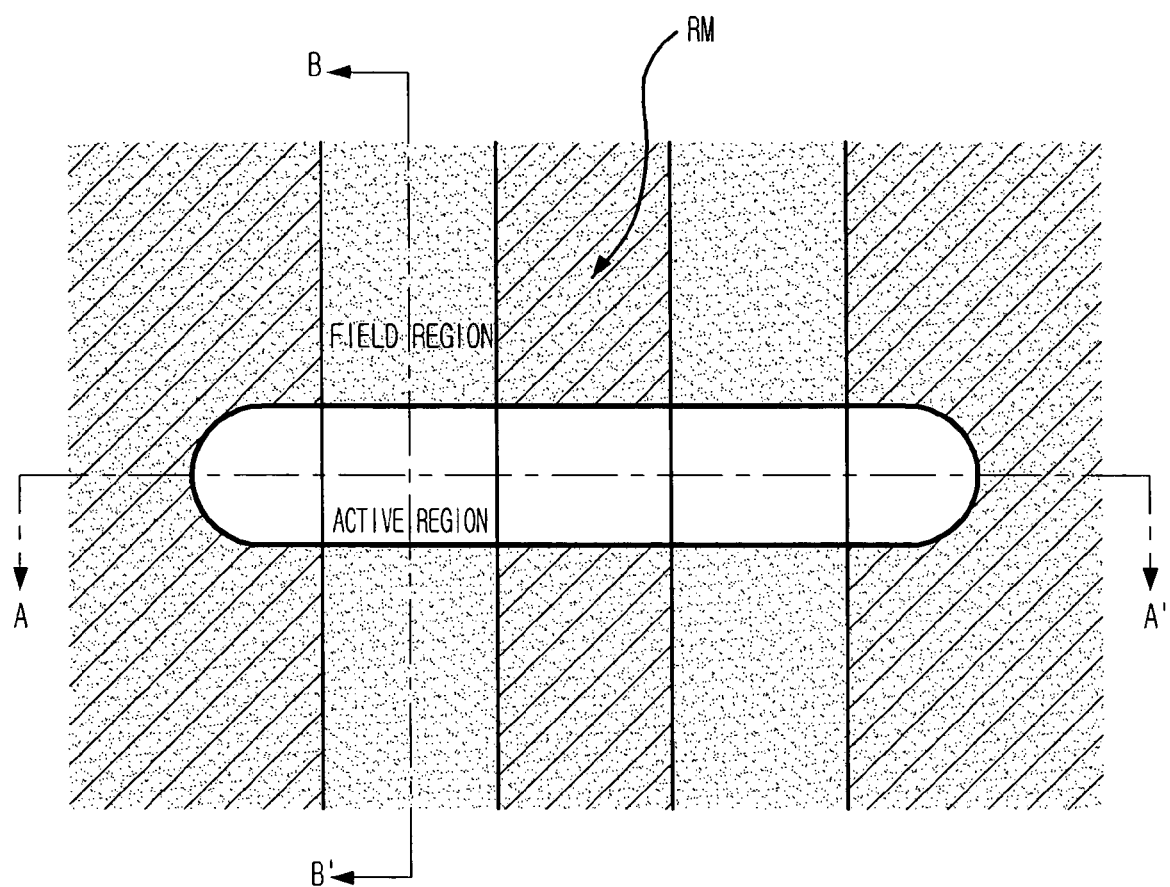
FIG. 2 illustrates a plan view of an active region and a field region with a recess mask pattern formed over the active region and the field region.

FIG. 2 illustrates a plan view of an active region and a field region with a recess mask pattern formed over the active region and the field region. The active region and the field region are defined through a device isolation process. A recess mask pattern RM is formed over the active and field regions along a minor axis direction B-B' of the active region. In a sectional view taken along the line B-B', i.e., the minor axis direction of the active region, a boundary region between the field region and the active region is not covered with the recess mask pattern RM. The recess mask pattern RM includes a hard mask in general.

FIGS. 3A to 3D illustrate cross-sectional views of a method of fabricating a recess gate in a semiconductor device in accordance with an embodiment of the present invention. Throughout FIGS. 3A to 3D, a left view is a sectional view taken along a major axis direction A-A' of the active region, and a right view is a sectional view taken along the minor axis direction B-B' of the active region.

Figure 3A:
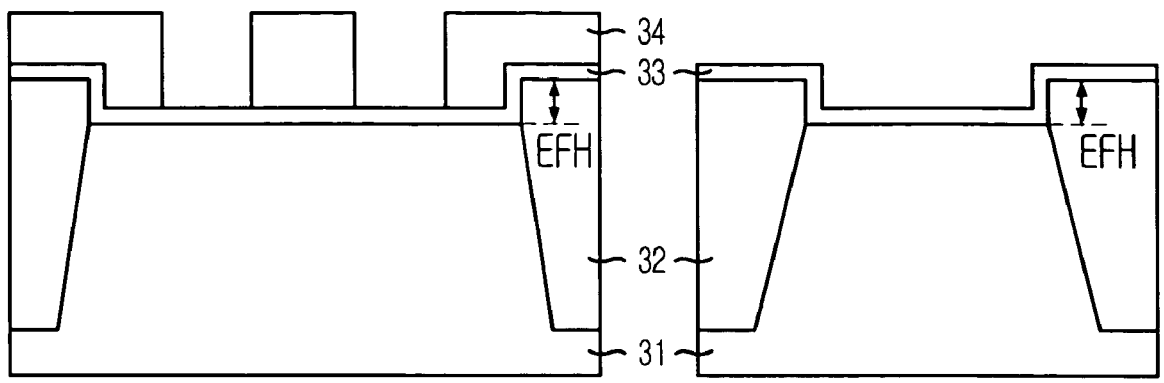
FIGS. 3A to 3D illustrate cross-sectional views of a method for fabricating a recess gate in a semiconductor device in accordance with some embodiments of the present invention.
Figure 3B:
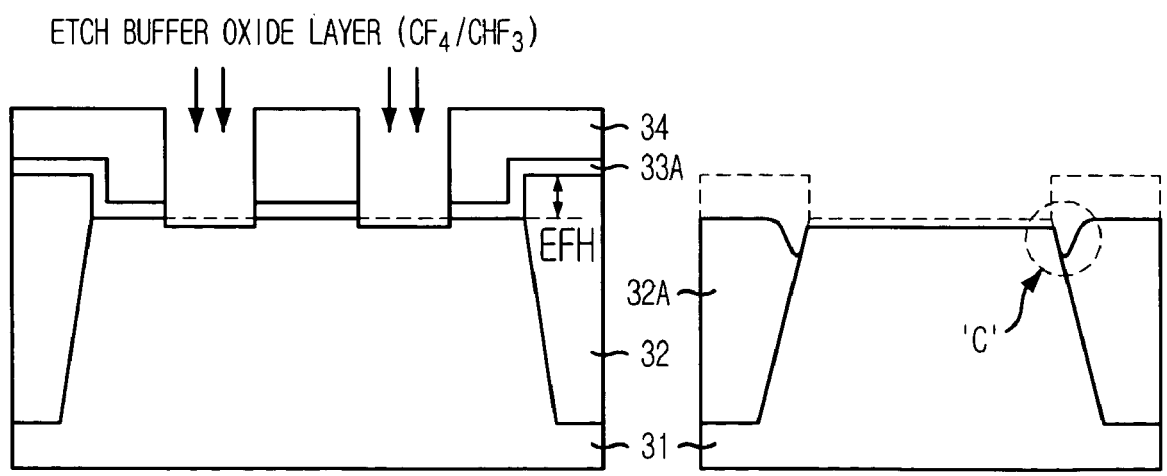

Referring to FIGS. 3A and 3B, a conventional shallow trench isolation (STI) is performed to form an isolation structure 32 in a substrate 31. The isolation structure 32 is formed deeper than a bottom surface of a recess pattern which will be formed in a following process. More specifically, a device isolation region of the substrate 31 is selectively etched to form a trench. In order to secure a gap-fill property of an oxide material for use as an isolation structure filled in the trench, the trench is formed to have a slope of which a tilt angle ranges from approximately 85° to approximately 89°. Afterwards, an oxide layer is deposited so as to fill the trench, and a planarization process such as a chemical mechanical polishing (CMP) is then performed to isolate the oxide layer within the trench, thereby completing the forming of the isolation structure 32. The top surface of the isolation structure 32 should be higher than the surface of the substrate 31 for securing an effective field oxide height (EFH).

A buffer oxide layer 33 is formed over the resultant structure including the isolation structure 32. The buffer oxide layer 33 plays a role in buffering stress between a material for a recess mask layer and the substrate 31 and also acts as an etch stop layer during the etching of the recess mask layer. Thereafter, a hard mask pattern 34 for forming a recess (hereinafter, referred to as a recess mask pattern 34) is formed on the buffer oxide layer 33. Herein, the recess mask pattern 34 will be used as an etch barrier together with the buffer oxide layer 33 during a following recess etch process. The recess mask pattern 34, for example, may be formed of polysilicon. The recess mask pattern 34 is formed through a typical lithography process. That is, the recess mask pattern 34 may be formed by etching a hard mask layer using a certain photoresist pattern as an etch mask until the buffer oxide layer 33 is exposed. For example, the hard mask layer is etched by using chlorine-based gas under transformer-coupled plasma (TCP) or inductively-coupled plasma (ICP) type plasma source.

Afterwards, referring to FIG. 3B, the etching of the oxide layer, i.e., the buffer oxide layer 33 and the isolation structure 32, is performed before etching the substrate 31. In some of the typical methods, the substrate, i.e., silicon substrate, is directly etched after forming the recess mask pattern 34. However, in accordance with some embodiments of the present invention, prior to the etching of the substrate 31, the exposed oxide layer including the isolation structure 32 as well as the buffer oxide layer 33 is etched to a certain depth under condition of high etch selectivity with respect to the substrate 31 including silicon. Reference denotations 32A and 33A represent a recessed isolation structure and a patterned buffer oxide layer, respectively.

In an embodiment, an etch rate of the oxide layer is at least three times greater than that of silicon, and more particularly, the etch rate of the oxide layer is approximately 3 times to approximately 6 times greater than the etch rate of the silicon substrate. In other words, the oxide layer is etched on condition that an etch rate ratio of the silicon substrate to the oxide layer ranges approximately 1:3-6. More specifically, the etching of the oxide layer is performed using a mixed gas of CF-based gas and CHF-based gas, wherein a flow rate ratio of the CF-based gas to the CHF-based gas ranges approximately 1-3:1, wherein the CF-based gas may include tetrafluoromethane ($CF_4$) and the CHF-based gas may include fluoroform ($CHF_3$). In addition, the etching process is performed in transformer-coupled plasma (TCP), inductively-coupled plasma (ICP), or magnetic enhanced reactive ion beam etching (MERIE) type plasma source. Using the TCP or ICP type plasma source, a source power is applied ranging from approximately 200 W to approximately 700 W. Using the MERIE type plasma source, a source power is applied ranging from approximately 300 W to approximately 1,000 W, and a bottom power is applied ranging from approximately 50 W to approximately 200 W.

In the TCP or ICP type plasma source, when the etching of the buffer oxide layer 33 is performed with a certain etch recipe that a pressure is 40 mT; 500 W power is applied; and a mixed gas of $45CF_4/15CHF_3$ is used as a main gas with $5O_2$ and 50 Ar added, the etch rates of the oxide layer and the silicon substrate become approximately 39 Å/second and approximately 13 Å/second, respectively. Thus, it is possible to maintain the etch rate ratio of the oxide to the silicon to be approximately 3:1.

As a result, the buffer oxide layer 33 on the region exposed by the recess mask pattern 34 is etched (see the left view of FIG. 3B), and the isolation structure 32 uncovered with the recess mask pattern 34 is partially etched (see the right view of FIG. 3B). Thus, a crevasse C is formed at an edge of the recessed isolation structure 32A in the vicinity of the active region.

After etching the oxide layer, a wet etch process may be additionally performed using buffered oxide etchant (BOE) or hydrofluoric acid (HF) so as to control the size of the crevasse C formed at the edge of the recessed isolation structure 32A.

Figure 1A:
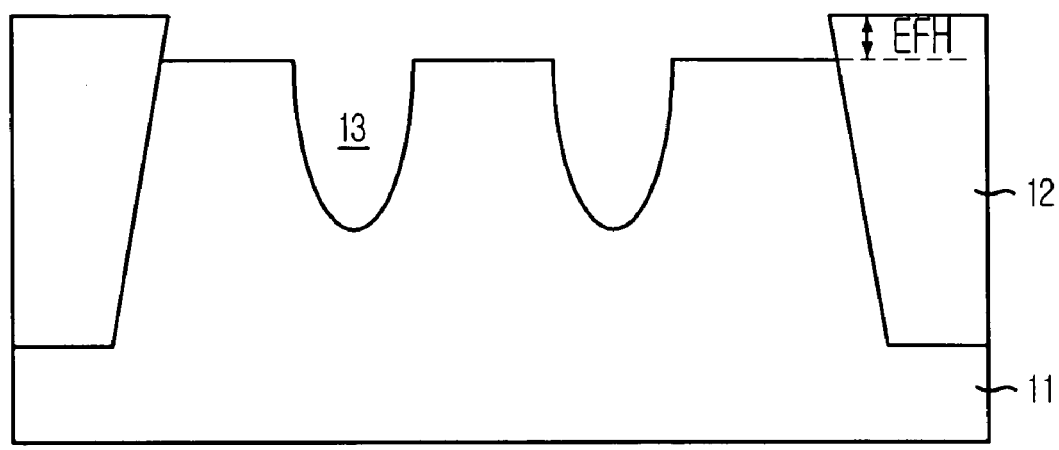
FIGS. 1A and 1B illustrate cross-sectional views of a recess pattern of a semiconductor device according to a typical method.
Figure 1B:
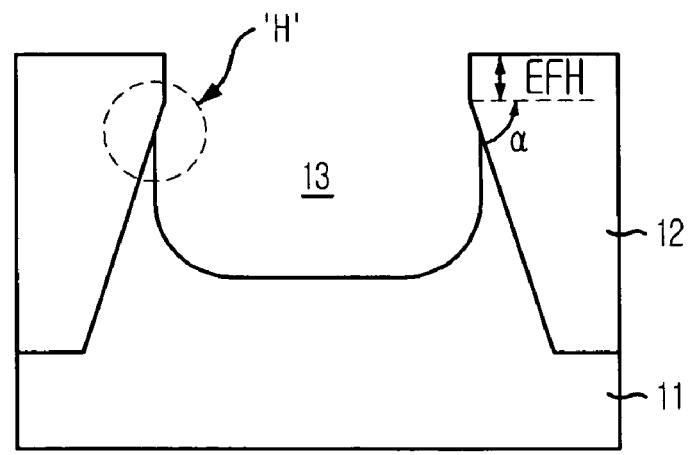
Figure 1C:
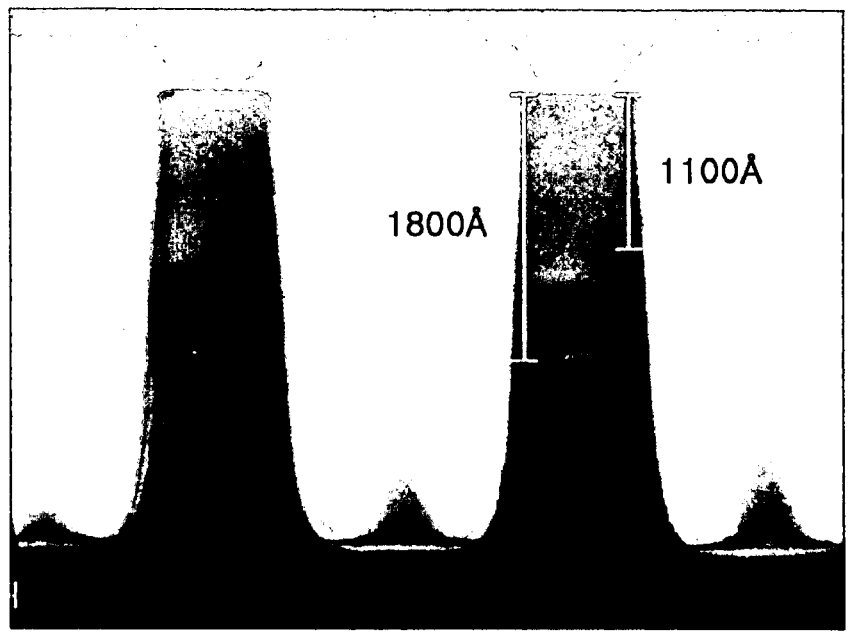
FIGS. 1C and 1D illustrate scanning electron microscope (SEM) micrographs of a horn occurring in a typical semiconductor device.
Figure 1D:
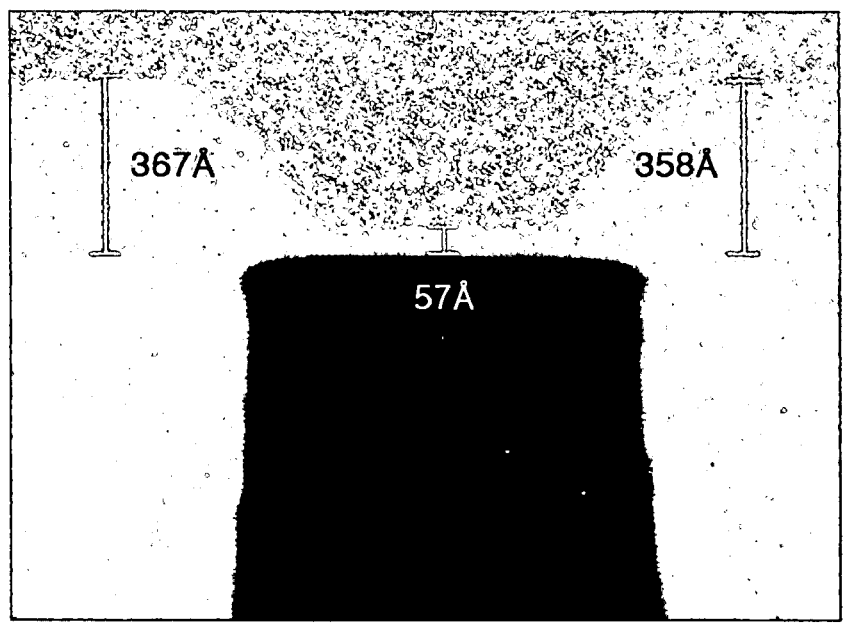
Figure 3C:
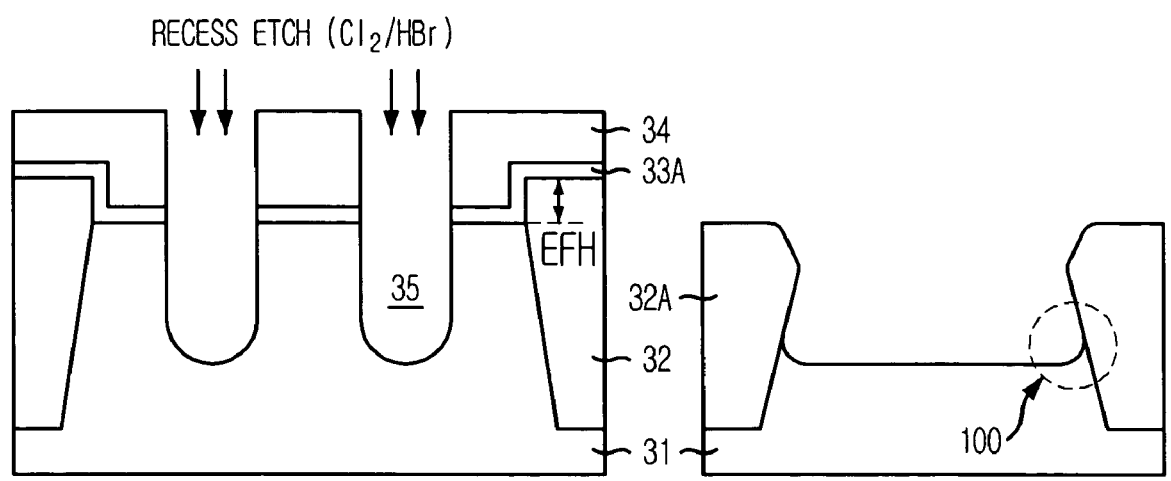

Referring to FIG. 3C, the substrate 31 is etched using the recess mask pattern 34 as an etch mask to form a recess pattern 35. Herein, the recess pattern 35 is formed using chlorine-based gas and bromine-based gas, wherein the chlorine-based gas includes chlorine ($Cl_2$) gas and the bromine gas includes hydrogen bromide (HBr) gas. After the recess pattern 35 is formed, it can be understood from the right view of FIG. 3C that a horn 100 is reduced in comparison with the recess pattern 13 of FIG. 1B according to some of the typical method.

Figure 3D:
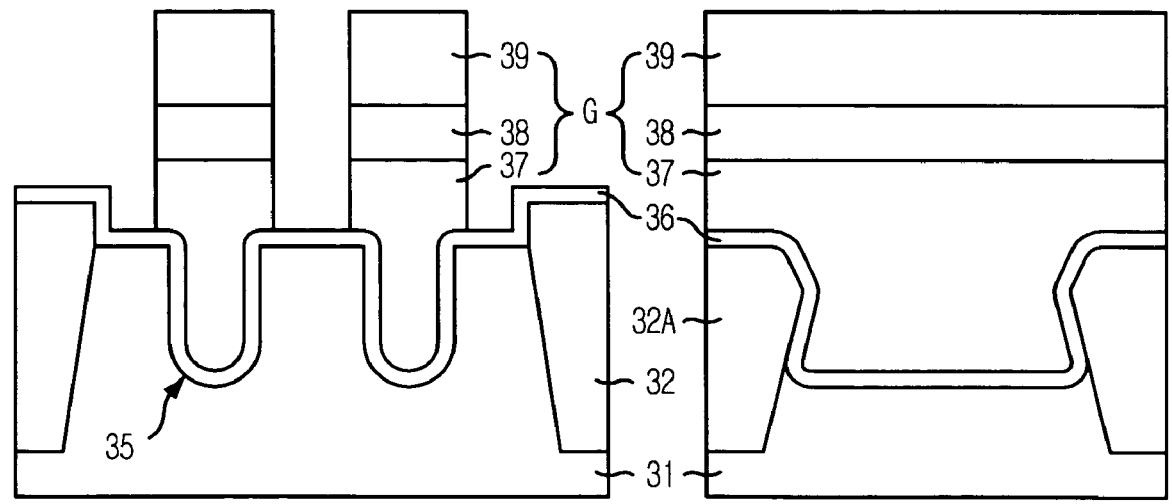

Referring to FIG. 3D, the recess mask pattern 34 and the patterned buffer oxide layer 33A are removed, and a gate insulating layer 36 and a gate pattern G are formed. Here, it is possible to form the gate insulating layer 36 without degradation of characteristics because the horn 100 of the recess pattern 35 is reduced, notwithstanding that the gate insulating layer 36 is formed by the conventional oxidation process. The gate pattern G is configured with a polysilicon electrode 37, a metal or a metal silicide electrode 38, and a gate hard mask 39 in a stack structure. For example, the metal or metal silicide electrode 38 may be formed of tungsten or tungsten silicide.

In accordance with the present invention, the horn of the recess pattern, which is a cause of a leakage current in forming the recess gate, can be removed or lessened so that it is possible to lessen a weak point acting as a leakage current source and help to prevent the gate oxide layer form being degraded. Furthermore, the present invention may provide other advantages such as higher product yields and lower fabrication costs, which is helpful for achieving a bit cross. Here, a bit cross is a phenomenon where the price per bit of a high density device becomes lower than a price per bit of a lower density device.

While the present invention has been described with respect to specific embodiments, it will be apparent to those skilled in the art that various changes and modifications may be made without departing from the spirit and scope of the invention as defined in the following claims.

What is claimed is:

1. A method of fabricating a semiconductor device, the method comprising:
    forming an isolation structure in a substrate to define an active region;
    forming a recess mask pattern over the isolation structure and the active region;
    etching the isolation structure exposed by the recess mask pattern to a certain depth;
    etching the substrate to form a recess pattern; and
    forming a gate electrode over the recess pattern.

2. The method of claim 1, wherein the etching the isolation structure further comprises etching, wherein the etching rate of the isolation structure is greater than the etching rate of the substrate.

3. The method of claim 1, wherein the etching the isolation structure further comprises etching, wherein the etching rate of the isolation structure is approximately 3 times to approximately 6 times greater than the etching rate of the substrate.

4. The method of claim 1, wherein the isolation structure includes an oxide layer, and the substrate includes silicon.

5. The method of claim 4, wherein the etching the isolation structure further comprises using a gas comprising a CF-based gas and a CHF-based gas.

6. The method of claim 5, wherein using the gas comprising the CF-based gas and the CHF-based gas further comprises using a flow rate ratio of the CF-based gas to the CHF-based gas ranging approximately 1-3:1.

7. The method of claim 5, wherein the CF-based gas includes tetrafluoromethane ($CF_4$) gas and the CHF-based gas includes fluoroform ($CHF_3$) gas.

8. The method of claim 7, wherein the etching the isolation structure further comprises etching using a plasma source selected from a group consisting of a transformer coupled plasma (TCP), an inductively coupled plasma (ICP), and a magnetic enhanced reactive ion beam etching (MERIE) type plasma source.

9. The method of claim 7, wherein the etching the isolation structure further comprises etching using at least one of the TCP type plasma source and the ICP type plasma source under a source power ranging from approximately 200 W to approximately 700 W.

10. The method of claim 7, wherein the etching the isolation structure further comprises etching using the MERIE type plasma source under a source power ranging from approximately 300 W to approximately 1,000 W and a bottom power ranging from approximately 50 W to approximately 200 W.

11. A method of fabricating a semiconductor device, the method comprising:
forming an isolation structure in a silicon substrate to define an active region;
forming a buffer oxide layer over the isolation structure and the active region;
forming a recess mask pattern over the buffer oxide layer;
etching the isolation structure and the buffer oxide layer exposed by the recess mask pattern;
forming a recess pattern by etching the silicon substrate with a first recipe having an etch rate greater for the silicon substrate than the buffer oxide layer or the isolation structure; and
forming a gate electrode over the recess pattern.

12. The method of claim 11, wherein the recess mask pattern includes a polysilicon hard mask.

13. The method of claim 11, wherein the etching the isolation structure and the buffer oxide layer is performed with a second recipe having an etch rate greater for the isolation structure and the buffer oxide layer than for the silicon substrate.

14. The method of claim 11, wherein the second recipe comprises a gas including a CF-based gas and a CHF-based gas.

15. The method of claim 14, wherein a flow rate ratio of the CF-based gas to the CHF-based gas of the second recipe ranges approximately 1-3:1.

16. The method of claim 14, wherein the CF-based gas includes $CF_4$ gas and the CHF-based gas includes $CHF_3$ gas.

17. The method of claim 11, wherein the etching the isolation structure and the buffer oxide layer further comprises etching using a plasma source selected from a group consisting of a transformer coupled plasma (TCP), an inductively coupled plasma (ICP), and a magnetic enhanced reactive ion beam etching (MERIE) type plasma source.

18. The method of claim 11, wherein the etching the isolation structure and the buffer oxide layer further comprises etching in at least one of the TCP type plasma source and the ICP type plasma source under a source power ranging from approximately 200 W to approximately 700 W.

19. The method of claim 11, wherein the etching the isolation structure and the buffer oxide layer further comprises etching in the MERIE type plasma source under a source power ranging from approximately 300 W to approximately 1,000 W and a bottom power ranging from approximately 50 W to approximately 200 W.

* * * * *